(12) United States Patent
Higashimoto et al.

(10) Patent No.: US 6,433,479 B1
(45) Date of Patent: Aug. 13, 2002

(54) SHORT-ARC DISCHARGE LAMP

(75) Inventors: Youichirou Higashimoto; Takumi Yamane, both of Himeji (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/552,674

(22) Filed: Apr. 19, 2000

(30) Foreign Application Priority Data

Apr. 23, 1999 (JP) ............................. 11-116825

(51) Int. Cl.$^7$ ............................. H01J 17/18; H01J 61/36
(52) U.S. Cl. ........................................ 313/623; 313/625
(58) Field of Search ................................. 313/623, 491, 313/631, 632, 284, 285, 286, 287, 288, 331, 332, 625

(56) References Cited

U.S. PATENT DOCUMENTS

RE31,519 E * 2/1984 Sobieski ..................... 313/332
5,200,669 A * 4/1993 Dixon et al. ................. 313/623
5,576,598 A * 11/1996 Zaslavsky et al. ........... 313/623

* cited by examiner

Primary Examiner—Nimeshkumar D. Patel
Assistant Examiner—Thelma Sheree Clove
(74) Attorney, Agent, or Firm—Nixon Peabody LLP; David S. Safran

(57) ABSTRACT

To reliably prevent the appearance of cracks in the sealing tube, a short-arc discharge lamp having a bulb with a light-emitting tube and sealing tubes connected to both sides of the light-emitting tube, with an anode and a cathode positioned facing each other within the light-emitting tube on the ends of electrode rods that pass through sleeve material that is supported by the sealing tubes, in which short-arc discharge lamp molybdenum foil is located between the sleeve material and the sealing tube, the outer surface of the molybdenum foil which faces the sealing tube has a surface treatment with a high-melting-point, oxidation resistant metal. The high-melting-point metal is preferably chosen from among tungsten, rhenium, tantalum, rhodium and platinum.

2 Claims, 5 Drawing Sheets

SHORT-ARC DISCHARGE LAMP

BACKGROUND OF THE INVENTION

1. Field of the Invention

This invention concerns a short-arc type discharge lamp used for a light source in such applications as projectors, exposure or semiconductors, ultraviolet hardening and so on.

2. Description of Related Art

Short-arc discharge lamps have been used, for example, as light sources in light source equipment, such as projectors or other light projection equipment. In such short-arc discharge lamps, a cathode and anode have faced each other within a bulb made of quartz glass, in which xenon gas, for example, was sealed.

FIG. 5 is a cross-sectional explanatory drawing that shows one example of a conventional short-arc discharge lamp. The bulb 30 of this short-arc discharge lamp comprises a light-emitting tube 31 to which an outwardly extending sealing tube 32 is connected at each side. A constricted portion 32a, which is a part of the sealing tube 32, is formed where the sealing tube 32 joins the light-emitting tube 31.

Within the light-emitting tube 31, a cathode 33 and anode 34 are located facing each other. The cathode 33 and the anode 34 are each mounted on the end of an electrode rod which passes through a sleeve material 35 of quartz glass, for example, and projects outward through the sealing tube 32. An air seal 37 is formed by fusing the end of the sealing tube 32 to the electrode rod 35. The sleeve material 36 is fastened in place by fusing it into a single piece with the constricted portion 32a. In this way, the electrode rod 35 is held in place by the sleeve material 36 and the end of the sealing tube 32.

FIG. 6 is a cross-sectional explanatory drawing of a key part of the short-arc discharge lamp shown in FIG. 5. A pendant ridge 38 formed when the constricted portion 32a of the sealing tube 32 is formed extends around the full inner circumference of the sealing tube 32 near to the end of the sleeve material 36 which is closest to the light-emitting tube 31. A wedge-shaped space 39 is thus formed between the pendant ridge 38 and the end of the sleeve material 36 that is closest to the light-emitting tube 31. The constricted portion 32a of the sealing tube 32 is formed by reducing the diameter of the sealing tube 32, by means of heating a portion of the outer periphery of the sealing tube 32 while the pressure within the bulb is reduced, for example, to between $1 \times 10^{-3}$ and $1 \times 10^{-4}$ Torr.

However, in recent years, there have been demands for greater lighting power in these short-arc discharge lamps. To satisfy these demands, it has become necessary to increase the amount of gas sealed into the light-emitting tube 31, leading to the problem that, when the amount of gas sealed into the light-emitting tube 31 of this kind of short-arc discharge lamp is increased, the pressure of the gas sealed within the light-emitting bulb 31 increases to perhaps 7500 Torr or more when the lamp is lit. The sleeve material 36 and the constricted portion 32a are fused into a single piece, so that the stress is concentrated on the wedge-shaped space 39 and cracks appear in the constricted portion 32a. When the lamp is turned on and off repeatedly, the cracking progresses until finally the sealing tube 32 is broken.

In order to prevent cracks from appearing in the sealing tube 32 in this way, it has been proposed that the sleeve material 36 be fixed in place while preventing the constricted portion 32a of the sealing tube 32 and the sleeve material 36 from fusing into a single piece, by means of placing molybdenum foil between the sleeve material 36 and the constricted portion 32a. It has been found, however, that even with such a construction, it is not possible to completely resolve the problem described above, and cracks sometimes appear in the constricted portion when the lamp is turned on and off repeatedly.

SUMMARY OF THE INVENTION

This invention was perfected as a result of long research to understand the causes of the problem stated above. Its purpose is to reliably prevent the appearance of cracks in the sealing tube, and thus to provide a short-arc discharge lamp with a long service life.

The short-arc discharge lamp of this invention is one having a bulb comprising a light-emitting tube and sealing tubes connected to both sides of the light-emitting tube, with an anode and a cathode positioned facing each other within the light-emitting tube, the anode and cathode being on the ends of electrode rods that pass through sleeve material that is supported by the sealing tubes, in which short-arc discharge lamp, molybdenum foil is located between the sleeve material and the sealing tube, the outer surface of the molybdenum foil which faces the sealing tube having undergone surface treatment with a high-melting-point metal that is resistant to oxidation. The high-melting-point metal is preferably chosen from among tungsten, rhenium, tantalum, rhodium and platinum.

In the arrangement described above, molybdenum foil is located between the sleeve material and the sealing tube, and the outer surface of the molybdenum foil which faces the sealing tube has undergone surface treatment with a high-melting-point metal with resistance to oxidation. Because of this, the molybdenum foil does not fuse with the sealing tube, and it is possible to prevent the appearance of cracks in the sealing tube, and as a result, it is possible to obtain a short-arc discharge lamp with long service life.

These and further objects, features and advantages of the present invention will become apparent from the following description when taken in connection with the accompanying drawings which, for purposes of illustration only, show a single embodiment in accordance with the present invention.

DETAILED DESCRIPTION OF THE INVENTION

Figure 1:
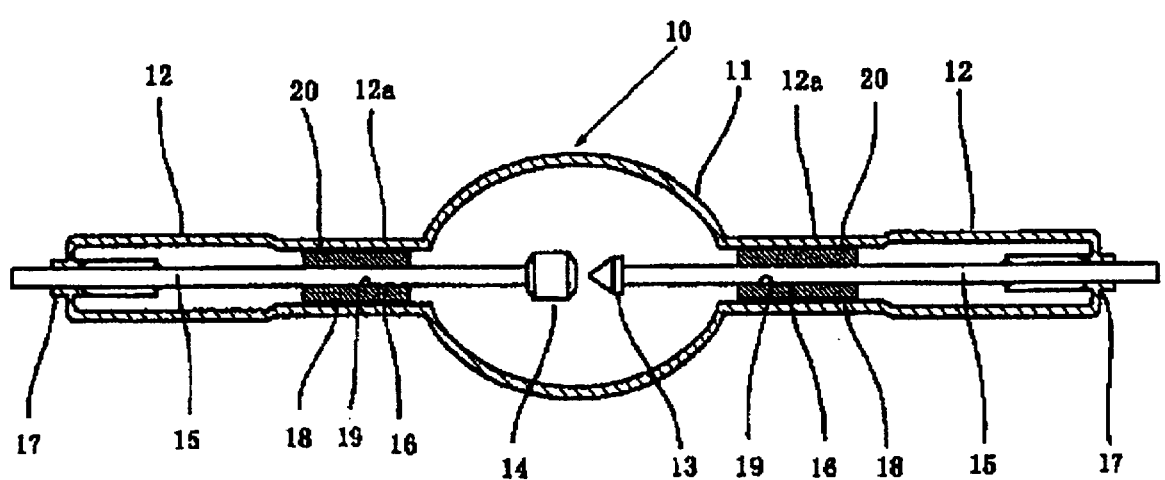
FIG. 1 is a cross-sectional view of an embodiment of the short-arc discharge lamp of this invention.
Figure 2:
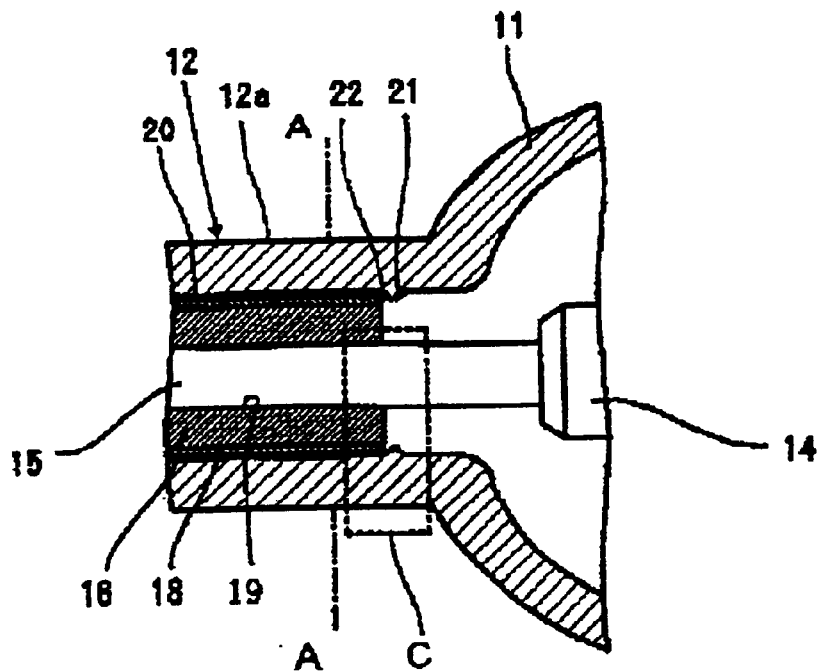
FIG. 2 is a cross-sectional view of a key part of the short-arc discharge lamp shown in FIG. 1.

The bulb 10 in the short-arc discharge lamp of this embodiment is formed of quartz glass, and comprises an ellipsoidal light-emitting tube 11 and cylindrical sealing tubes 12 that are connected to and extend outward from opposite sides of the light-emitting tube 11. There is a constricted portion 12a on each sealing tube 12 near to where the sealing tube 12 connects to the light-emitting tube 11.

A cathode 13 and an anode 14 are located facing each other within the light-emitting tube 11 of the bulb 10. Each of the cathode 13 and the anode 14 is fixed to the end of and is held in place by an electrode rod 15 made of a tungsten rod, for example.

The electrode rod 15 extends along the center axis of the sealing tube 12, and the back end of it projects from the sealing tube 12. At the outer end of the sealing tube 12, an air seal 17 is formed by fusing the sealing tube 12 to the electrode rod 15.

An inert gas, such as xenon, argon or krypton, is sealed within the light-emitting tube 11 of the bulb 10, singly or in combination, and a light-emitting substance, such as mercury, is also included if necessary. The pressure of the included gas will be at least 1,500 Torr when the lamp is lit, and preferably 15,000 Torr or more.

Figure 3:
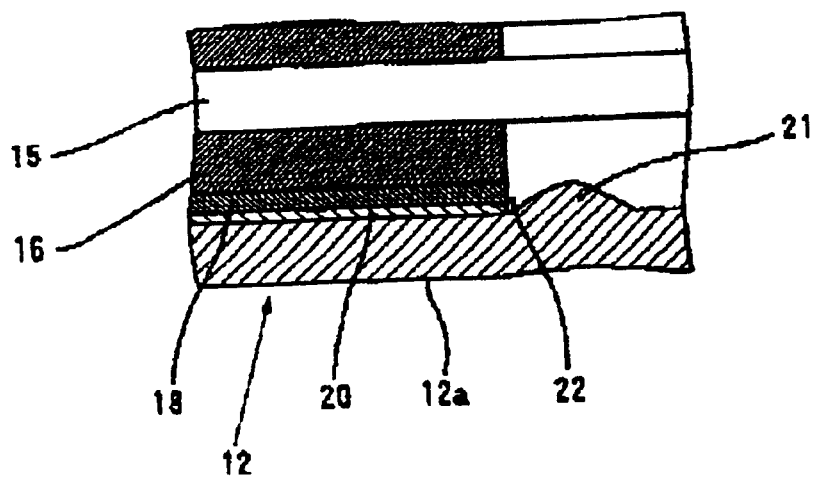
FIG. 3 is an enlarged drawing of the area enclosed by broken lines in FIG. 2.
Figure 4:
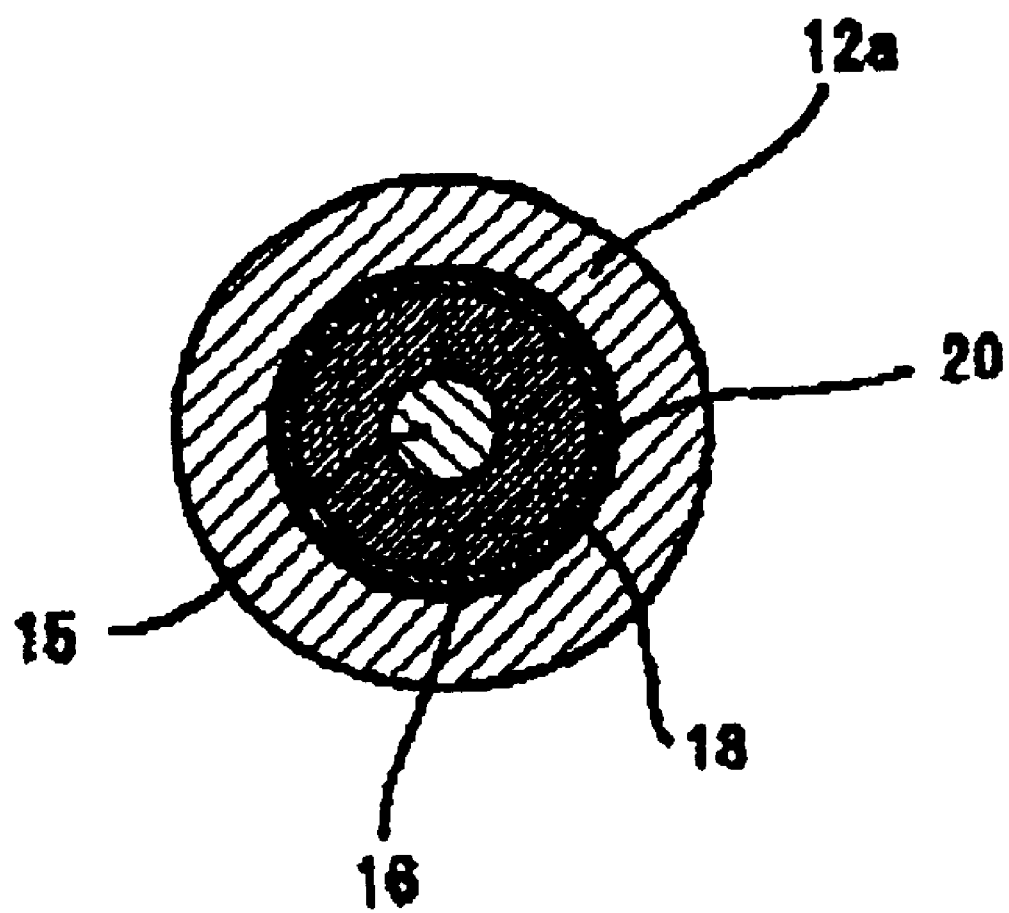
FIG. 4 is a cross section taken at line A—A in FIG. 2.
Figure 5:
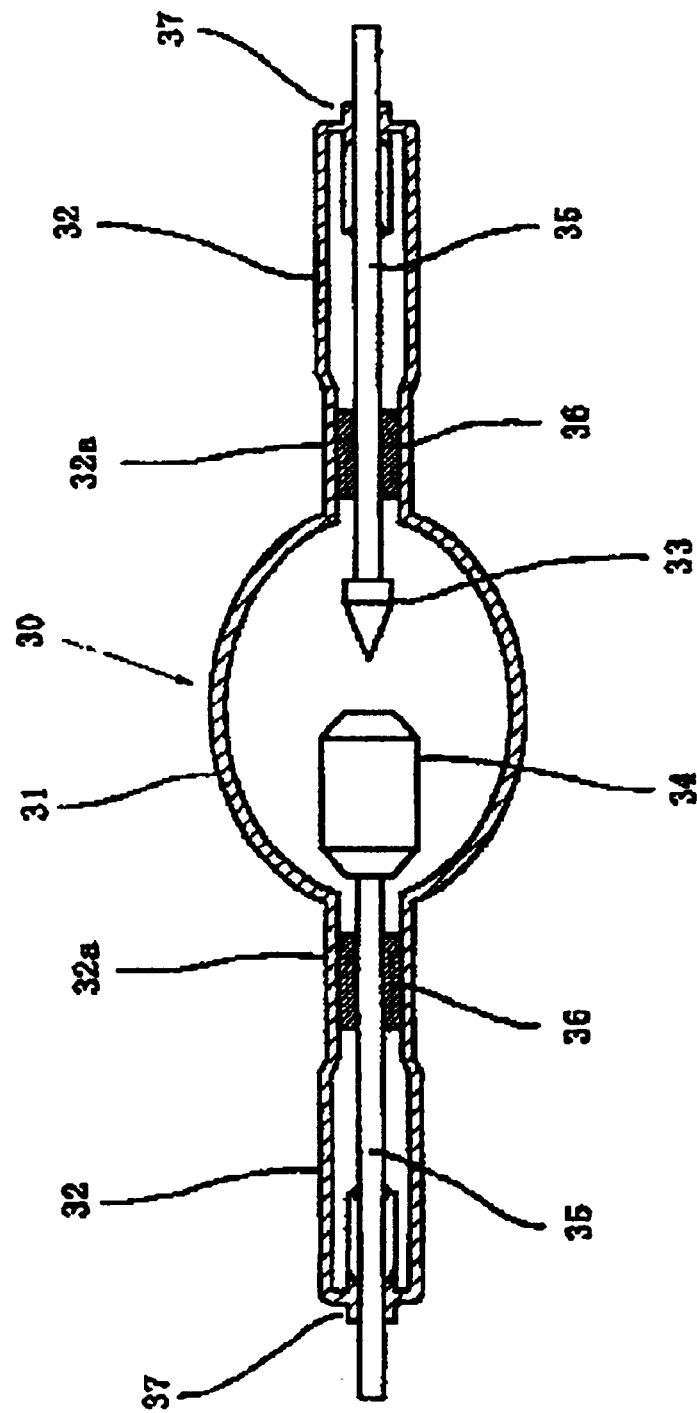
Figure 6:
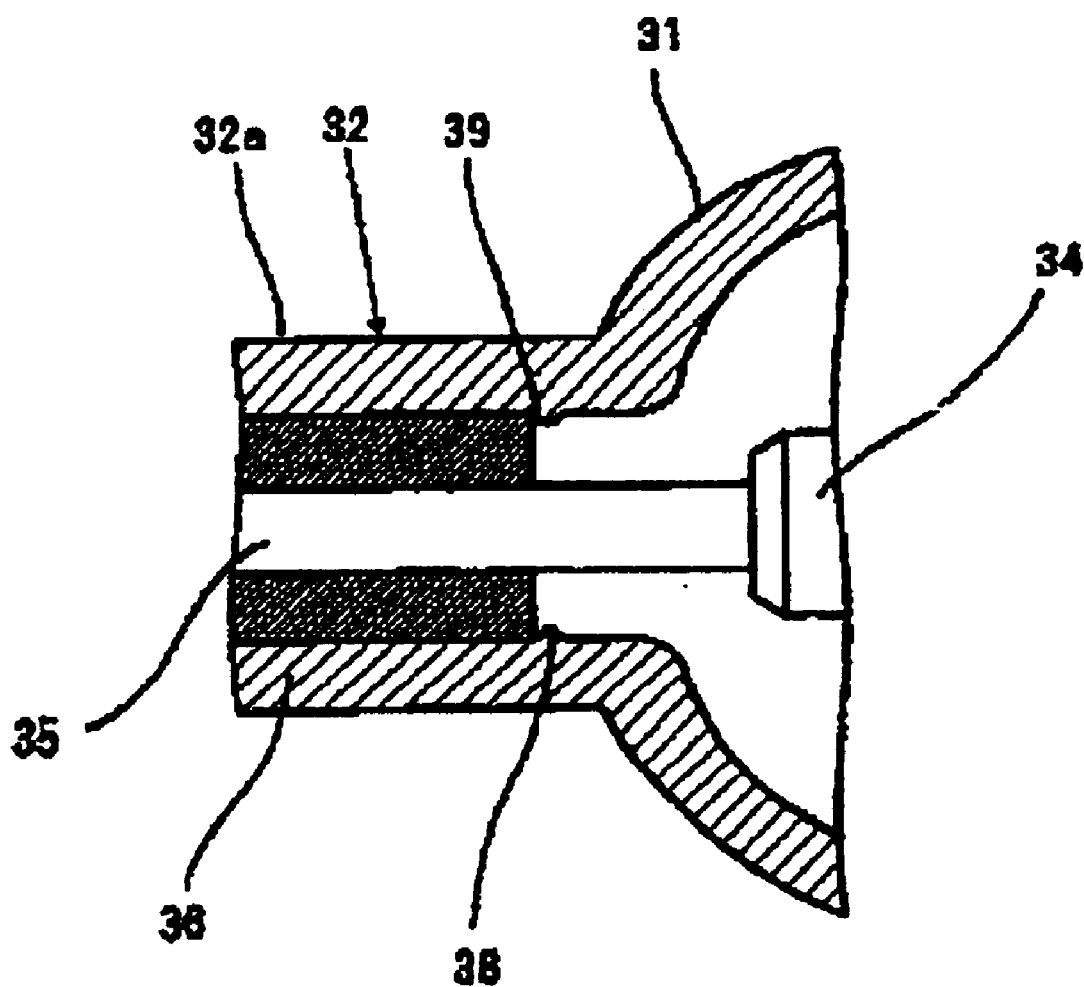

A sleeve material 16 of quartz glass is located within the sealing tube 12. It is pierced by a through-hole 19 that is appropriate to the outer diameter of the electrode rod 15, and the electrode rod 15 passes through it. This sleeve material 16 is held in place in the constricted portion 12a of the sealing tube 12 by a pendant ridge 21 (FIG. 3) which creates a wedge-shaped space 22.

A molybdenum foil 18 is located between the outer periphery of the sleeve material 16 and the constricted portion 12a of the sealing tube 12, and can be mounted on the outer periphery of the sleeve material 16. The outer surface of this molybdenum foil 18, which is in contact with the inner surface of the constricted portion 12a of the sealing tube 12, has a thin film 20 formed by surface treatment with a high-melting-point metal which is resistant to oxidation. The thickness of the thin film 20 formed on the surface of the molybdenum foil 18 is preferably between 0.1 and 4 $\mu$m, and the thickness of the foil itself is preferably 20 $\mu$m or less. If the thickness of the foil is greater than 20 $\mu$m, the molybdenum foil 18 becomes excessively rigid and spring-back occurs when the foil is wrapped around the outer periphery of the sleeve material 16, making application of the foil difficult.

Such metals as tungsten, rhenium, tantalum, rhodium or platinum are specific examples of high-melting-point metals which are resistant to oxidation that can be used for surface treatment of the molybdenum foil 18. The method of surface treatment of the molybdenum foil 18 can be, for example, plating, vapor deposition or flame spraying.

In a short-arc discharge lamp constituted as described above, the molybdenum foil 18 is located between the sleeve material 16 and the constricted portion 12a of the sealing tube 12, and the outer surface of the molybdenum foil 18 that is in contact with the inner surface of the constricted portion 12a of the sealing tube 12 has been surface treated with a high-melting-point metal with resistance to oxidation. Because of this, cracks do not appear in the constricted portion 12a even in the event that pressure of the gas included in the light-emitting tube 11 is high.

The reason for this is thought to be that, because the molybdenum foil 18 has been surface treated with a high-melting-point, oxidation resistant metal, no oxidation products of molybdenum form, and when the constricted portion 12a of the sealing tube 12 is formed, the molybdenum foil 18 is kept from fusing with the sealing tube 12. Therefore, the great stress that originates in the fusion of the molybdenum foil 18 and the sealing tube 12 does not occur, and so the appearance of cracks in the constricted portion 12a can be reliably prevented.

In other words, in discharge lamps in which molybdenum foil that has not undergone surface treatment is interposed between the sleeve material 16 and the sealing tube 12, it is thought that when the sealing tube 12 is heated to form the constricted portion 12a, the quartz glass of the sealing tube 12 fuses with the outer surface of the molybdenum foil 18 because of the formation of oxides on the outer surface of the molybdenum foil 18, and as a result, there is great residual stress when the constricted portion 12a cools and cracks appear in the constricted portion 12a.

Moreover, because the molybdenum foil 18 has been surface treated with a high-melting point, oxidation resistant metal, no oxidation products of molybdenum are formed on the surface of the molybdenum foil 18, and even if oxidation products of the high-melting-point metal are formed, those oxidation products have low affinity for the quartz glass of the constricted portion 12a. Therefore, the molybdenum foil 18 does not fuse with the constricted portion 12a.

As stated above, in the short-arc discharge lamp of this invention, the seal structure is not damaged even if the pressure of the sealed gas is high when the lamp is lit, and the lamp has a long service life. The effect of this is particularly prominent in discharge lamps in which the pressure of the sealed gas is 15,000 Torr or above when the lamp is lit. Accordingly, it is possible to have short-arc discharge lamps with high lighting power.

A test case of this invention is explained below.

Test Case 1

A xenon short-arc discharge lamp with a rated power of 2 kW was built following the structure in FIG. 1. The bulb 10 of this discharge lamp had a maximum outside diameter of 42 mm and inside volume of 53 $cm^3$; the sealing tube 12 had an outside diameter of 22.5 mm, inside diameter of 17.5 mm, and length of 40 mm; and the constricted portion 12a had an outside diameter of 20 mm, inside diameter of 12 mm, and length of 30 mm.

The electrode rod 15 was a tungsten rod 4 mm in diameter. The cathode 13 had a maximum outside diameter of 8.0 mm and length of 9.0 mm. The anode 14 had a maximum outside diameter of 10.3 mm and length of 12 mm. The gap between the cathode 13 and anode 14 was 3.5 mm. 15,000 Torr of xenon gas was sealed within the bulb 10. The sleeve material 16 was made of quartz glass with an outside diameter of 12 mm, inside diameter of 6 mm, and length of 30 mm. The molybdenum foil 18 was 15 $\mu$m thick, and one surface was plated with rhodium to form a thin film 0.5 $\mu$m thick; it was wrapped to the extent of 1.5 turns of the outer periphery of the sleeve material 16.

Ten discharge lamps built in this way were tested by turning them off and on. No cracks appeared in the constricted portion 12a even after 3,000 hours of aggregate operation. It was confirmed that the lamp had a long service life and maintained stable lighting.

Control Case 1

Xenon short-arc discharge lamps were built in the same way as in test case 1, except that the molybdenum foil did not undergo surface treatment with rhodium. Ten discharge lamps built in this way were tested in the same way as in test case 1. After about 2,000 hours of aggregate operation, it was confirmed that cracks had appeared in the constricted portions of seven of the discharge lamps.

In the test case above, the constricted portion was formed by reducing the diameter of a portion of the sealing tube; but, it is sometimes unnecessary to reduce the diameter of the sealing tube to hold the sleeve material in place; the effectiveness of this invention is not impaired in such cases.

In the short-arc discharge lamp of this invention, molybdenum foil is located between the sleeve material and the sealing tube, and the surface of the molybdenum foil next to the sealing tube has undergone surface treatment with a high-melting-point metal with resistance to oxidation. It is possible, by this means to prevent the appearance of cracks in the sealing tube, and accordingly it is possible to obtain short-arc discharge lamps with long service life.

We claim:

1. A short-arc discharge lamp having a bulb comprising a light-emitting tube and sealing tubes connected to both sides of the light-emitting tube, an anode and a cathode positioned facing each other within the light-emitting tube on the ends of electrode rods, a quartz glass sleeve that is penetrated by the electrode rods and supported in the sealing tubes, and a molybdenum foil located between the quartz glass sleeve and the sealing tube; wherein an outer surface of the molybdenum foil which faces the sealing tube has an applied surface treatment of a high-melting point, oxidation resistant metal.

2. A short-arc discharge lamp as described in claim 1 above, in which the high-melting point, oxidation resistant metal is a metal from the group consisting of tungsten, rhenium, tantalum, rhodium, or platinum.

* * * * *